United States Patent
Pietambaram et al.

(10) Patent No.: US 11,810,859 B2
(45) Date of Patent: Nov. 7, 2023

(54) MULTI-LAYERED ADHESION PROMOTION FILMS

(71) Applicant: INTEL CORPORATION, Santa Clara, CA (US)

(72) Inventors: Srinivas V. Pietambaram, Chandler, AZ (US); Rahul N. Manepalli, Chandler, AZ (US); Cemil S. Geyik, Gilbert, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 749 days.

(21) Appl. No.: 16/793,951

(22) Filed: Feb. 18, 2020

(65) Prior Publication Data

US 2021/0257309 A1 Aug. 19, 2021

(51) Int. Cl.
*H01L 23/532* (2006.01)
*H01L 21/768* (2006.01)

(52) U.S. Cl.
CPC .. *H01L 23/53295* (2013.01); *H01L 21/76832* (2013.01); *H01L 21/76834* (2013.01)

(58) Field of Classification Search
CPC ......... H01L 23/53295; H01L 21/76832; H01L 21/76834; H01L 23/49822; H01L 21/76885; H01L 2223/6655; H01L 23/66
See application file for complete search history.

(56) References Cited

U.S. PATENT DOCUMENTS

2018/0301505 A1* 10/2018 Chuang .................. H10N 50/10
2020/0135562 A1* 4/2020 Chen .................. H01L 21/31116
2021/0100104 A1* 4/2021 Sung .................. H01F 17/0013

* cited by examiner

*Primary Examiner* — Karen Kusumakar
(74) *Attorney, Agent, or Firm* — Schwabe, Williamson & Wyatt, P.C.

(57) ABSTRACT

Structures are described that include multi-layered adhesion promotion films over a conductive structure in a microelectronic package. The multi-layered aspect provides adhesion to surrounding dielectric material without a roughened surface of the conductive structure. Furthermore, the multi-layered aspect allows for materials with different dielectric constants to be used, the average of which can provide a closer match to the dielectric constant of the surrounding dielectric material. According to an embodiment, a first dielectric layer that includes at least one nitride material can provide good adhesion with the underlying conductive structure, while one or more subsequent dielectric layers that include at least one oxide material can provide different dielectric constant values (e.g., typically lower) compared to the first dielectric layer to bring the overall dielectric constant closer to that of a surrounding dielectric material. The first and second layers may be discrete layers or a single continuous layer with grading.

19 Claims, 8 Drawing Sheets

MULTI-LAYERED ADHESION PROMOTION FILMS

BACKGROUND

For transmission line structures, power loss during transmission of an electrical signal can be due to (i) conductor loss and/or (ii) dielectric loss. Conductor loss is due in part to the bulk conductivity of the material used for the conductive structure. Another contribution to conductor loss is the surface roughness of the conductive structure itself. Surface roughness can be important in high frequency applications because electrical current can preferentially travel on the surface of a conductive structure at high frequencies. Conductive structures having more surface roughness thus have a higher effective resistivity and correspondingly higher signal loss. Dielectric loss is due in part to the difference in the dielectric constants of the materials surrounding the conductive structure.

The Figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Multi-layered adhesion promotion films for microelectronic packages are disclosed. Although the adhesion promotion films can be used in any number of applications, they are particularly well-suited for being provisioned around (and in some cases on) conductive structures, such as transmission lines, vias, and other conductive pathways that carry high frequency signals. The conductive structures can be formed in a relatively narrow trench (e.g., conductive line) or hole (e.g., conductive via). As will be explained in turn, the multi-layered adhesion promotion films provide adhesion to the surrounding dielectric material without needing to roughen the surface of the conductive structure. Furthermore, the multi-layered aspect allows for materials with different dielectric constants to be used, the average of which can provide a closer match to the dielectric constant of the surrounding dielectric material. For example, according to one such embodiment, the multi-layered structure includes a first layer over a conductive structure, where the first layer has a first dielectric constant, and a second layer over the first layer having a second dielectric constant. A dielectric material (such as an organic dielectric) is laminated or otherwise disposed over the second layer and has a third dielectric constant. The first dielectric constant is greater than the third dielectric constant, and the second dielectric constant is less than the third dielectric constant. The multi-layered aspect of the adhesion promoter films allows the structure to have good adhesion with a non-roughened conductive structure while providing a relatively better dielectric constant match to the surrounding dielectric material, as compared to standard adhesion promoter schemes. Numerous configurations and variations will be apparent in light of this disclosure.

General Overview

Figure 1:
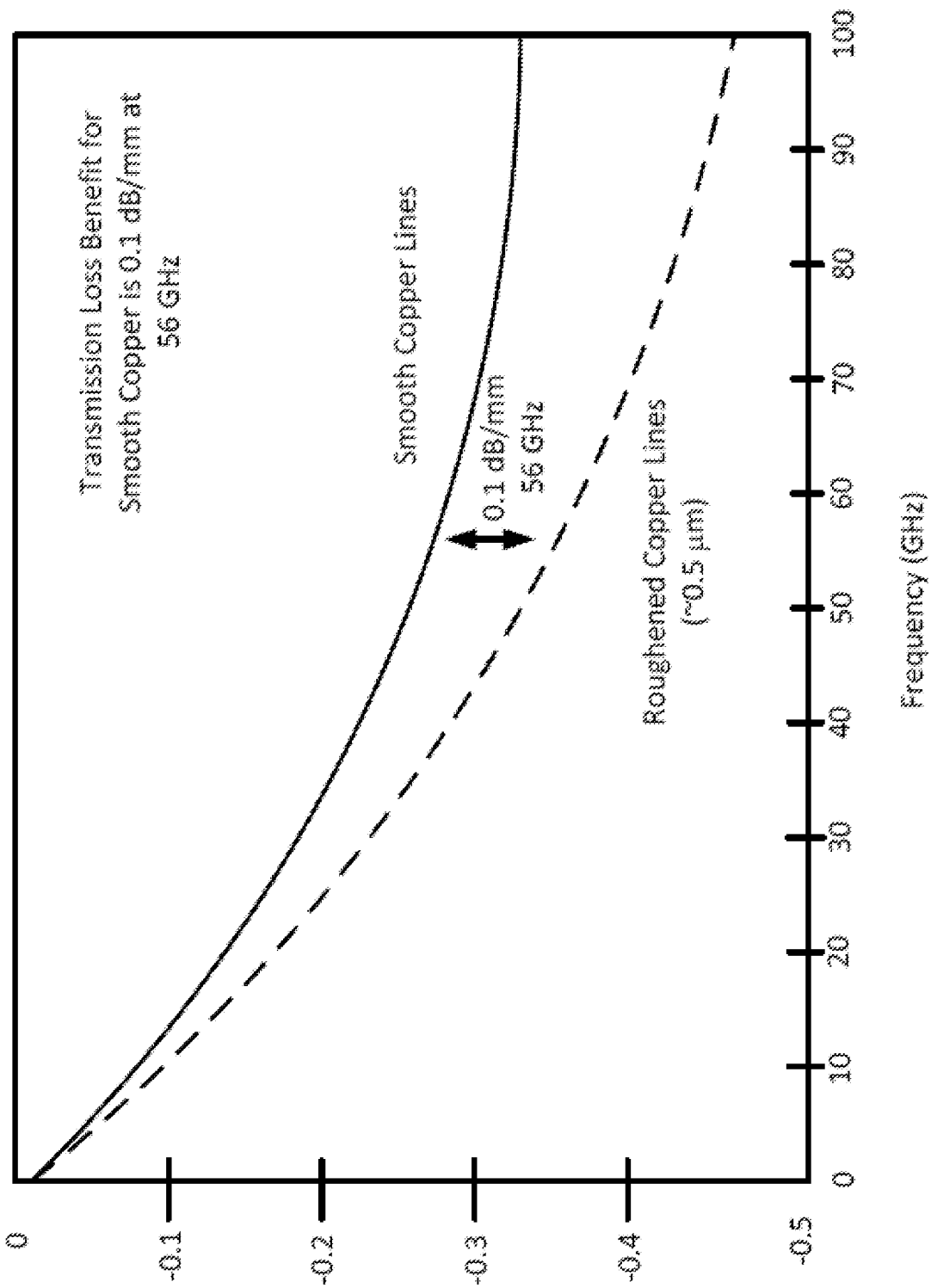
FIG. 1 illustrates plots of simulated insertion losses over a range of frequencies of a signal transmitted through a copper transmission line having a smooth surface compared to insertion loss of a signal transmitted through a copper trace having a roughened surface, in accordance with an embodiment of the present disclosure.
Figure 2B:
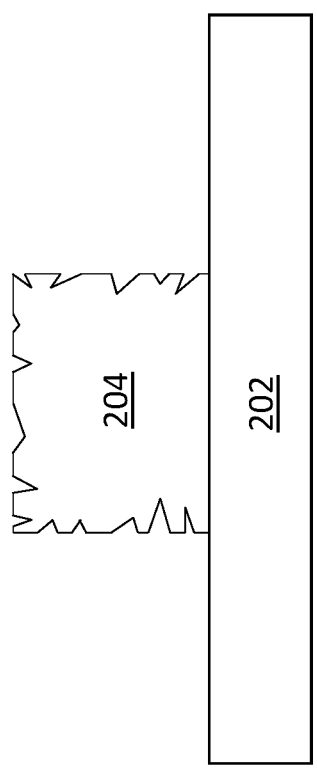
FIGS. 2A and 2B are cross-sectional views of a microelectronic package substrate (taken perpendicular to a plane of the substrate) that include a conductive structure, in which surfaces of the conductive structure are roughened to improve adhesion with a surrounding dielectric layer.
Figure 2A:
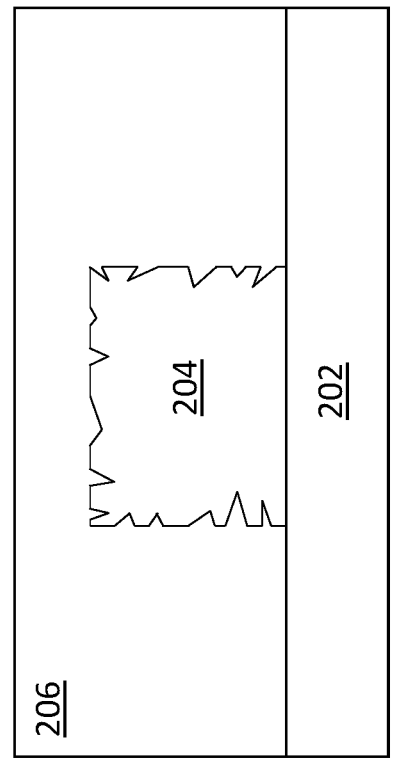

Microelectronic package substrates generally include conductive structures that are surrounded by dielectric material. Unfortunately, there are competing interests that should be considered, particularly with respect to the smoothness of the conductive structures (or roughness, as the case may be) and adhesion quality between the conductive structure and the surrounding dielectric material. In more detail, signals transmitted through the conductive structures can be degraded through various loss mechanisms, one of which can be a function of the surface roughness of the conductor, as previously noted. This is particularly true of high frequency signals, such as radio frequency (RF) and microwave signals. In the context of a high frequency transmission line, this increased resistivity can cause an impedance mismatch with respect to the impedance of the source of the input signal being applied to the transmission line. Such an impedance mismatch can cause input signal loss (sometimes referred to as insertion loss). This effect increases with increasing signal frequency, thus impacting the performance of electronic devices such as mobile communication devices that transmit and receive at high frequencies (e.g., from say 300 megahertz to one or more gigahertz, or higher). Reducing surface roughness of conductive structures in packages can reduce the electrical resistance of the conductors and thus improve performance of the device as a whole, particularly at high frequencies. This is seen in FIG. 1 where smooth copper lines exhibit lower signal loss per millimeter compared to roughened copper lines, especially at higher frequencies. However, despite the adverse effect of surface roughness on signal loss, sometimes conductive structures are intentionally exposed to an appropriately composed etchant to create a relatively jagged, irregular surface topography, such as indicated in FIG. 2A. As can be seen, a portion of an integrated circuit package 200 includes a package substrate or dielectric layer 202 with a roughened conductor 204. Conductor 204 is intentionally roughened to improve adhesion with certain organic dielectric materials.

Such organic dielectric materials are beneficial for use in integrated circuit packages due to their low loss characteristics and ease of integration with many fabrication techniques, although any number of dielectric fill materials can be used. In any case, the surface roughness on the conductive structure improves adhesion with the surrounding organic dielectric layer by providing mechanical anchors and connection points therebetween. This is illustrated in FIG. 2B with adhesion between conductor 204 and the surrounding dielectric layer 206 improved due to the roughened surface of conductor 204. Accordingly, there are conflicting interests with respect to conductor surface roughness.

Thus, techniques are described herein for the formation of multi-layered adhesion promotion films over a conductive structure in a microelectronic package, which provide adhesion to the surrounding dielectric material without needing to roughen the surface of the conductive structure. Furthermore, the multi-layered aspect allows for materials with different dielectric constants to be used, the average of which can provide a closer match to the dielectric constant of the surrounding dielectric material. A structure according to one embodiment comprises a first dielectric layer that includes at least one nitride material that can provide good adhesion with the underlying conductive structure while one or more subsequent dielectric layers that include at least one oxide material that can provide different dielectric constant values (e.g., lower) compared to the first dielectric layer to bring the overall dielectric constant closer to that of a surrounding dielectric material. In this way, adhesion to the unroughened surface of the conductive structure is still enhanced without creating a large dielectric mismatch by using compositionally distinct adhesion promotion layers.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

In addition, some layers or materials provided herein are in the form of compounds, such as a silicon nitride ($Si_yN_x$) layer. Other example layer compositions include, in various embodiments, oxides, carbides, oxycarbides, and oxynitrides of titanium, tantalum, and silicon, such as silicon carbide, silicon oxynitride, and silicon oxycarbide. Note that the stoichiometry of such compounds may vary from one embodiment to the next, and compounds represented without specific stoichiometric coefficients or values are intended to represent all forms of that compound, as will be appreciated.

EXAMPLE STRUCTURE

Figure 3A:
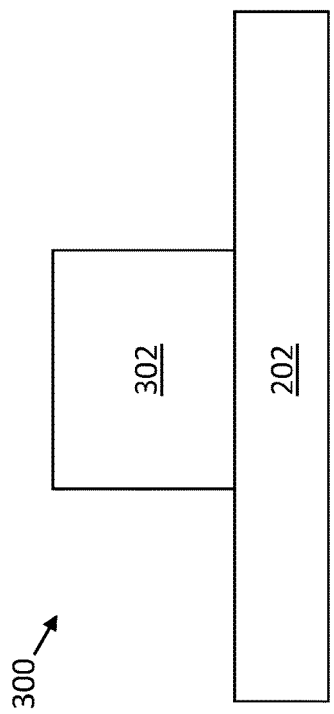
FIGS. 3A-3C collectively illustrate cross-sectional views of a fabrication process for a portion of a microelectronic package substrate having a multi-layered adhesion promoter over a conductive structure, in accordance with some embodiments of the present disclosure.
Figure 3B:
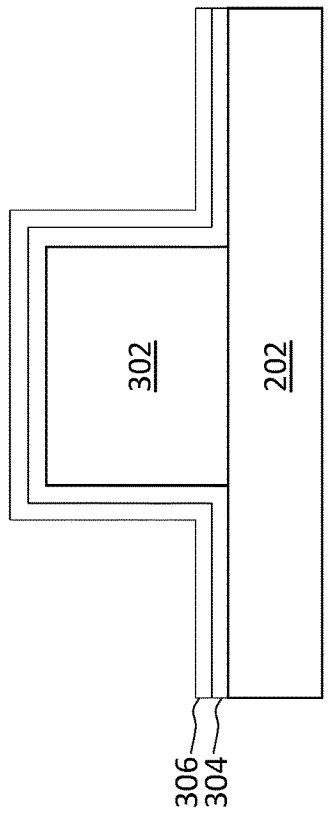
Figure 3C:
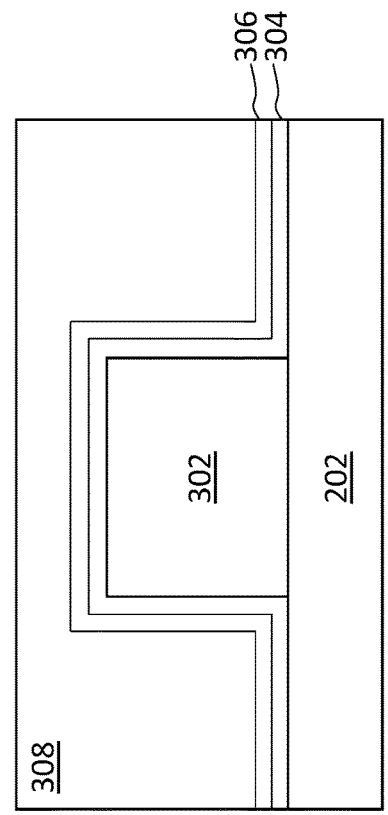

FIGS. 3A-3C collectively illustrate an example fabrication process for a portion of an integrated circuit package 300, according to an embodiment of the present disclosure. As can be seen, FIG. 3A illustrates a conductive structure 302 (e.g., copper, aluminum, tungsten, or any alloys thereof, or other suitable conductive materials) patterned on a lower dielectric layer 202. Dielectric layer 202 may be one of many dielectric layers within integrated circuit package 300. Similarly, conductive structure 302 may be a metal trace on any given metal level within integrated circuit package 300. In some embodiments, conductive structure 302 is part of a microstrip transmission line.

According to an embodiment, a surface of conductive structure 302 has relatively low surface roughness, such as a surface roughness of less than 100 nm average root mean squared feature size when measured using an atomic force microscope (AFM). This low surface roughness reduces resistive loss for signals transmitted, in part, at a surface of a conductive structure 302. This can improve the integrity of signals transmitted through the conductive structure 302 (as previously discussed with reference to FIG. 1).

FIG. 3B illustrates the deposition of at least two dielectric layers over conductive structure 302 to act as a multi-layer adhesion promoter stack, according to some example embodiments. As can be seen, a first dielectric layer 304 is deposited over at least one surface of conductive structure 302 and in one such embodiments includes a nitride material, such as silicon nitride ($Si_yN_x$), titanium nitride (TiN), or tantalum nitride (TaN), to name a few examples. First dielectric layer 304 may be deposited as a relatively dense film having a high dielectric constant between about 5 and about 9. In some embodiments, the dielectric constant of first dielectric layer 304 is around 7. Nitride-containing materials exhibit strong adhesion with many conductive materials such as copper and can be deposited as a dense film to provide good hermeticity to protect conductive structure 302 from corrosion. Other comparable dielectric materials may be used as well, as will be appreciated.

First dielectric layer 304 may be deposited, for example, using standard deposition technique such as physical vapor deposition (PVD), chemical vapor deposition (CVD), plasma-enhanced chemical vapor deposition (PECVD), or atomic layer deposition (ALD), to name a few examples. According to some embodiments, first dielectric layer 304 is deposited to a final thickness between about 50 nm and about 250 nm. As will be further appreciated in light of this disclosure, the thickness and dielectric constant of layer 304 can vary from one embodiment to the next, and the present disclosure is not intended to be limited to any particular range of dielectric constants or set of dielectric materials. Numerous variations with respect to such parameters can be implemented.

A second dielectric layer 306 is deposited on first dielectric layer 304 and in some such embodiments includes an oxide material such as silicon oxide ($SiO_2$), silicon oxycarbide ($SiO_xC_y$), or silicon oxynitride ($SiO_xN_y$), to name a few examples, according to some embodiments. Second dielectric layer 306 has a relatively lower dielectric constant compared to first dielectric layer 304. Note that the absolute dielectric values of layers 304 and 306 may be different from the examples provided herein, depending on the specific dielectric materials used. In any such cases, the different dielectric constants and the relative difference between them can be used to provide a desired average dielectric constant, along with other desired properties (e.g., adhesion, electrical isolation, hermeticity, etc). In some such example embodiments, second dielectric layer 306 has a dielectric constant between about 3 and about 5. For example, $SiO_2$ has a dielectric constant around 3.9, while $SiO_xN_y$ has a dielectric constant ranging from 4 to 5 depending on the nitrogen content and $SiO_xC_y$ has a dielectric constant ranging from 2.3 to 3.8 depending on the carbon content. The presence of second dielectric layer 306 reduces the average dielectric constant combined between first dielectric layer 304 and second dielectric layer 306, according to an embodiment.

Like first dielectric layer 304, second dielectric layer 306 may be deposited using any standard deposition technique such as PVD, CVD, PECVD, or ALD, to name a few examples. According to some embodiments, second dielectric layer 306 is deposited to a final thickness between about 50 nm and about 250 nm. In some specific example embodiments, the final combined thickness of first dielectric layer 304 and second dielectric layer 306 is anywhere between 100 nm and 500 nm. Just as with layer 304, note that the thickness and dielectric constant of layer 306 can vary from one embodiment to the next, and the present disclosure is not intended to be limited to any particular geometries or material systems.

Although only two dielectric layers are illustrated as being part of the multi-layer adhesion promotion structure, any number of layers may be used. That is, in some embodiments, first dielectric layer 304 may represent any number of deposited material layers and second dielectric layer 306 may represent any number of additional deposited material layers, where the combined deposited material layers exhibit strong adhesion to the underlying conductive structure 302.

In still other embodiments, layers 304 and 306 may be part of an overall structure that is effectively one continuous layer (possibly with no visible seam as there might be between two discrete layers). In such an embodiment, one or more elements can be graded in concentration as the overall layer or structure transitions from a first dielectric portion 304 to a second dielectric portion 306. For instance, in one such example embodiment, the overall structure 304/306 is a continuous and seamless graded layer that includes a first portion 304 of silicon nitride and a second portion 306 of silicon oxide. In one such example case, the nitrogen concentration of the first portion 304 grades from a high level at the interface with the underlying conductor 302 to zero (or an otherwise relatively lower level), while the oxygen concentration of the second portion 306 grades from zero (or an otherwise relatively low level) to a high concentration at the top of the structure. The grading may be gradual to provide a linear change in concentration or more abrupt to provide a step-like change in concentration.

According to some embodiments, the average dielectric constant of the one or more material layers (whether graded or not) represented by second dielectric layer 306 is lower than the average dielectric constant of the one or more material layers (whether graded or not) of first dielectric layer 304. In some embodiments, and as explained above, one or more of the material layers used in one or both of first dielectric layer 304 and second dielectric layer 306 includes a graded index that changes along a thickness of the layer, and there may be no visible seam indicative of two distinct layers 304 and 306 in the overall structure that includes 304 and 306. In this sense, reference to "layers" 304 and 306 herein is intended to include not only one or more discrete layers for each of layers 304 and 306, but also the case where there is one continuous, seamless graded layer that includes a first portion 304 and a second portion 306, as will be appreciated.

FIG. 3C illustrates the resulting structure after deposition of a third dielectric layer 308 over second dielectric layer 306. According to some embodiments, third dielectric layer 308 includes an organic dielectric material, such as Ajinomoto Build-up Film (ABF) to name one example, although any number of dielectric fill materials can be used, as will be appreciated. Third dielectric layer 308 may be laminated or otherwise disposed over second dielectric layer 306 using any conventional deposition technique. According to some embodiments, third dielectric layer 308 has a dielectric constant that is lower than the dielectric constant of each of first dielectric layer 304 and second dielectric layer 306. For example, third dielectric layer 308 may have a dielectric constant between about 2.5 and about 3.5. In some embodiments, third dielectric layer 308 has a dielectric constant that is lower than the dielectric constant of either of first dielectric layer 304 or second dielectric layer 306. In still other embodiments, third dielectric layer 308 has a dielectric constant that is lower than the dielectric constant of first dielectric layer 304 and higher than the dielectric constant of second dielectric layer 306. In one such example embodiment, conductor 302 is copper or copper alloy, dielectric layer 304 is silicon nitride, dielectric layer 306 is silicon dioxide, and dielectric layer 308 is ABF.

Note that in some embodiments, an overall structure that includes dielectric layers 304, 306, and 308 can be a continuous, seamless graded layer. In such cases, process knob can be used to turn one and off the desired elements to provide the specific desired dielectric materials that make up the overall structure. For instance, in one such example embodiment, the overall structure 304/306/308 is a continuous and seamless graded layer that includes a first portion 304 of silicon nitride, a second portion 306 of silicon oxide, and a third portion of a dielectric similar in properties and composition to ABF. In one such example case, the nitrogen knob is manipulated to provide a nitrogen concentration of the first portion 304 that grades from a high level at the interface with the underlying conductor 302 to zero (or an otherwise relatively lower level), while the oxygen knob is simultaneously manipulated to provide an oxygen concentration of the second portion 306 that grades from zero (or an otherwise relatively low level) to a high concentration proximate portion 308, at which point the constituent knobs for depositing ABF can be manipulated to provide a desired concentration of the third portion 308 that grades from zero to some high concentration at the top of the overall structure. The grading may be gradual or more abrupt, as previously explained. Numerous such variations with any combination of graded seamless layers and/or discrete layers will be appreciated in light of this disclosure.

According to some embodiments, the presence of second dielectric layer 306 provides a smoother transition between the relatively high dielectric constant of first dielectric layer 304 and the relatively low dielectric constant of third dielectric layer 308. In some embodiments, the dielectric constant of second dielectric layer 306 is closer to the dielectric constant of third dielectric layer 308 than the dielectric constant of first dielectric layer 304. So, in one such example case, dielectric layer 304 has an average dielectric constant of about 7, dielectric layer 306 has an average dielectric constant of about 3.4, and dielectric layer 308 has an average dielectric constant of about 3.1. In some embodiments, the average of the dielectric constant of first dielectric layer 304 and the dielectric constant of second dielectric layer 306 is within ±1.0 of the dielectric constant of third dielectric layer 308. The dielectric constants of any number of dielectric layers may be averaged to be within ±1.0 of the dielectric constant of the outer-most dielectric layer from conductive structure 302.

FIGS. 4A-4D collectively illustrate various stages of fabrication of an electronics device 400 according to another embodiment of the present disclosure. The electronics device may represent a portion of an integrated circuit package. Note that the previous relevant discussion provided with reference to FIGS. 3A-3C is equally applicable here, including discussion with respect to example materials, example geometries, example forming methods, and grading versus discreet layers.

Figure 4A:
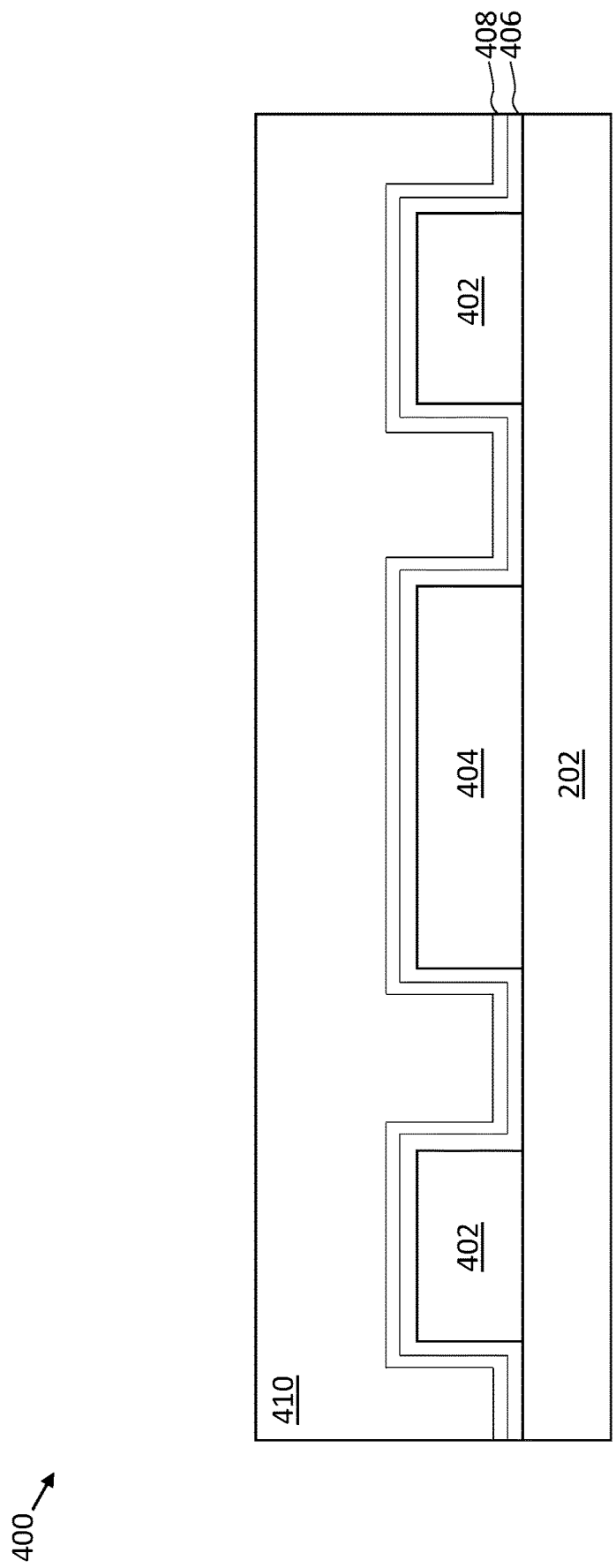
FIGS. 4A-4D collectively illustrate cross-sectional views of a fabrication process for a portion of a microelectronic package substrate having various levels of conductive structures using multi-layered adhesion promoters, in accordance with some embodiments of the present disclosure.

FIG. 4A illustrates formation of a first layer of conductive structures upon a lower dielectric layer 202. The conductive structures may include conductive traces 402 and a conductive pad 404 (e.g., copper, aluminum, alloys thereof, or any other suitable conductor materials, although any sized conductive structures may be patterned using standard lithography and deposition techniques (e.g., electroplating). Lower dielectric layer 202 may include, for example, one or more layers of an organic resin, such as an epoxy or other polymerizable resin (e.g., network polymer components, thermosetting polymer components, thermoplastic polymer components). Other materials can be added to the organic resin to promote hardening such as polymerization reaction initiators or hardeners. In some cases, filler materials can be added to the resin prior to hardening to alter the mechanical and/or electrical properties of lower dielectric layer 202. Example materials include micron-sized and/or nano-sized $SiO_2$ particles, among others. In one example, lower dielectric layer 202 is formed from ABF. Lower dielectric layer 202 may be any layer of a multi-layer structure that includes a plurality of laminated or otherwise deposited dielectric and conductor layers. In a more general sense, layer 202 may be any suitable dielectric layer or structure upon which conductive features 402 and 404 can be provisioned.

Deposited over each of conductive traces 402 and conductive pad 404 are a first dielectric layer 406 and a second dielectric layer 408, according to some embodiments. A third dielectric layer 410 is deposited over all of the structures and planarized using, for example, a chemical mechanical polishing (CMP) process. Alternatively, the third dielectric layer can be laminated with or without planarization. In some embodiments, third dielectric layer 410 is an organic dielectric material. Third dielectric layer 410 may have, for example, the same material composition as lower dielectric layer 202, but in other embodiments is a compositionally different material. The top surface of the planarized third dielectric layer 410 may be used as a surface for forming another layer of conductive structures. The previous discussion with respect to the grading of dielectric layers 304, 306, and 308 is equally applicable to layers dielectric 406, 408, and 410, respectively First dielectric layer 406 and second dielectric layer 408 may have the same features as discussed above for first dielectric layer 304 and second dielectric layer 306, respectively. Accordingly, first dielectric layer 406 may include a material that exhibits strong adhesion to the underlying conductive structures, such as a material that includes one or more nitrides. Second dielectric layer 408 may include a material having a lower dielectric constant than that of first dielectric layer 406, and in some embodiments, the dielectric constant of second dielectric layer 408 is closer to the dielectric constant of third dielectric layer 410 than to the dielectric constant of first dielectric layer 406. In some embodiments, the dielectric constant of first dielectric layer 406 is greater than the dielectric constant of second dielectric layer 408, which is greater than the dielectric constant of third dielectric layer 410.

In some embodiments, adhesion between first dielectric layer 406 and the underlying conductive structures is enhanced by first treating the exposed surfaces of the underlying conductive structures with ammonia or silane, to name a few examples, before depositing first dielectric layer 406. Furthermore, first dielectric layer 406 may be deposited using a dual-mode PECVD process to provide a highly dense film with good hermeticity to prevent formation of metal oxides on the surfaces of the conductive structures. In some embodiments, both first dielectric layer 406 and second dielectric layer 408 are deposited in-situ within the same deposition chamber using dual-mode PECVD by varying the process gases to form the different films. Accordingly, in some embodiments, there is no sharp transition between first dielectric layer 406 and second dielectric layer 408, but rather a transition from one material composition to another that includes one or more gradient concentrations along a thickness of the deposited film(s). As noted above, first dielectric layer 406 and second dielectric layer 408 may each represent any number of deposited films.

Figure 4B:
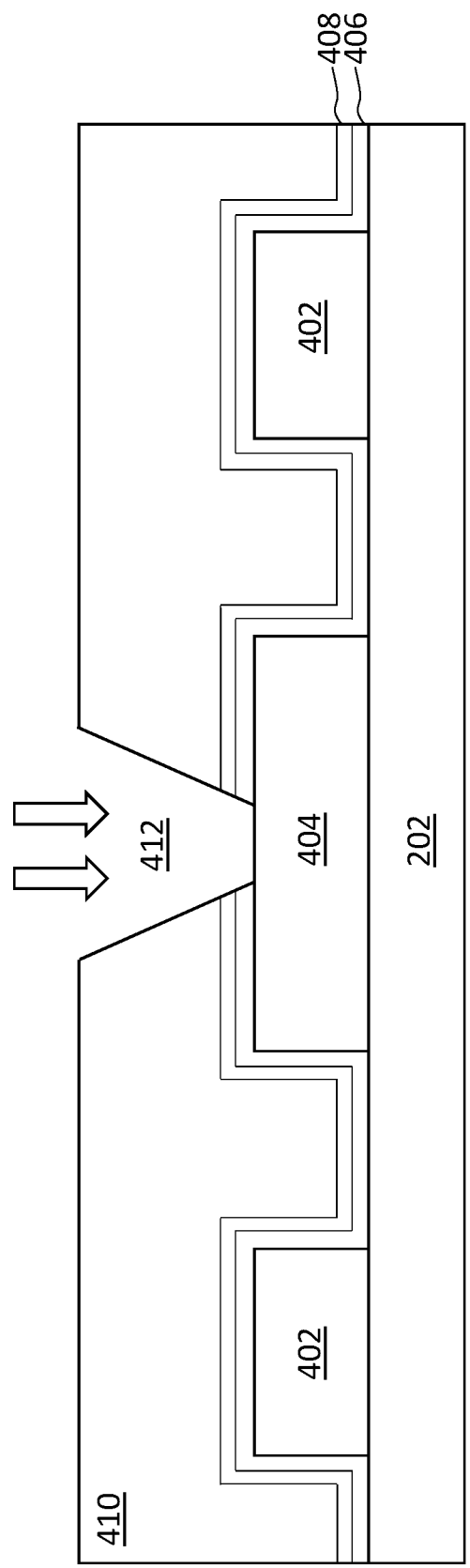

FIG. 4B illustrates a patterning process used to remove a portion of each of third dielectric layer 410, second dielectric layer 408, and first dielectric layer 406 to expose a surface of conductive pad 404. In some embodiments, the patterning process is performed using standard lithographic techniques with dry or wet etchants used to etch away portions of the aforementioned dielectric materials. In some embodiments, the patterning process is performed using laser drilling (e.g., to form a hole in which to form a via). In any such cases, the patterning process produces a recess 412 and a subsequent process can be applied to remove residue from within recess 412 created by the patterning and/or laser drilling. For example, an ultraviolet (UV) laser can be used to form recess 412 while a dry desmear/reactive ion etch process can be subsequently used to remove residue from recess 412. In another example, a $CO_2$ laser can be used to ablate through third dielectric layer 410, followed by a tetrafluoromethane ($CF_4$) reactive ion etch to punch through first dielectric layer 406 and second dielectric layer 408 and remove any residue within resulting recess 412.

Figure 4C:
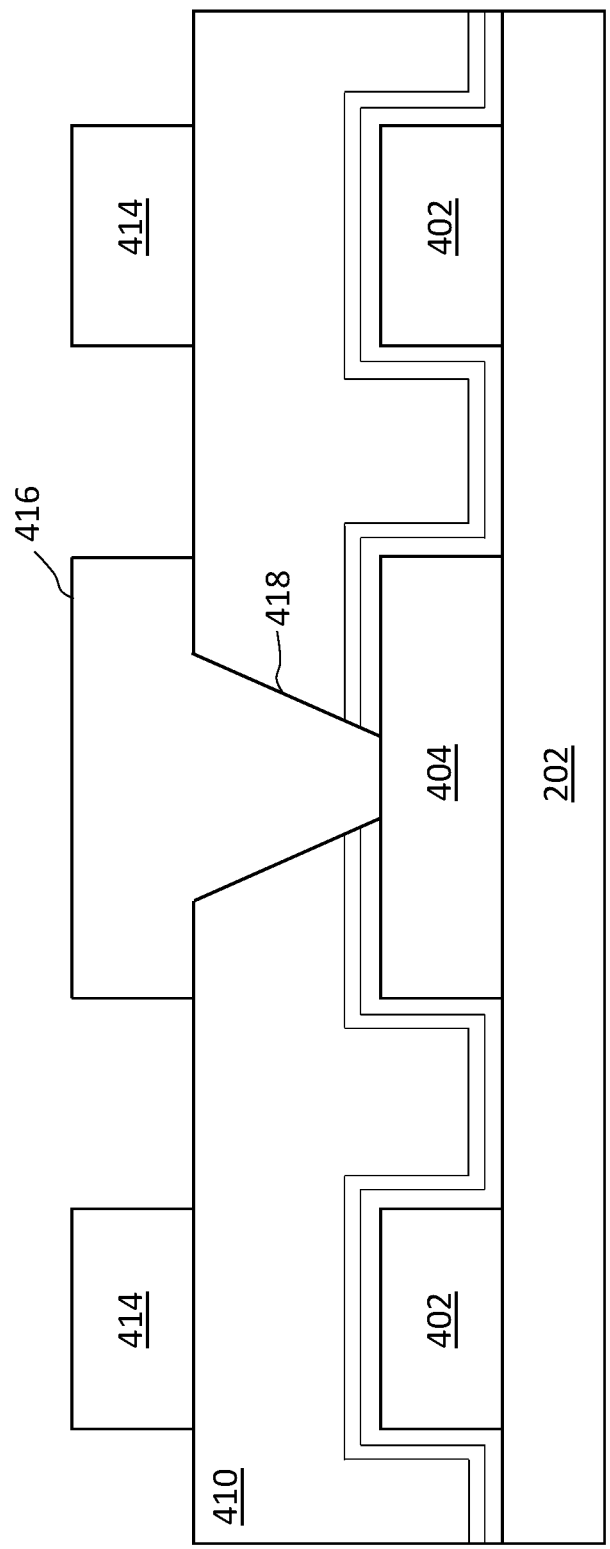

FIG. 4C illustrates the formation of a second level of conductive structures that includes conductive traces 414 and a conductive pad 416. As can be further seen, conductive pad 416 is electrically coupled to conductive pad 404 using a metal via 418 that substantially fills recess 412. Any of conductive traces 414 and conductive pad 416 can be formed using similar techniques to those discussed above for forming conductive traces 402 and conductive pad 404. In some embodiments, a conductive seed layer is deposited along the surface of third dielectric layer 410 and along the surfaces of recess 412 to facilitate metal electroplating to form the various conductive structures.

Figure 4D:
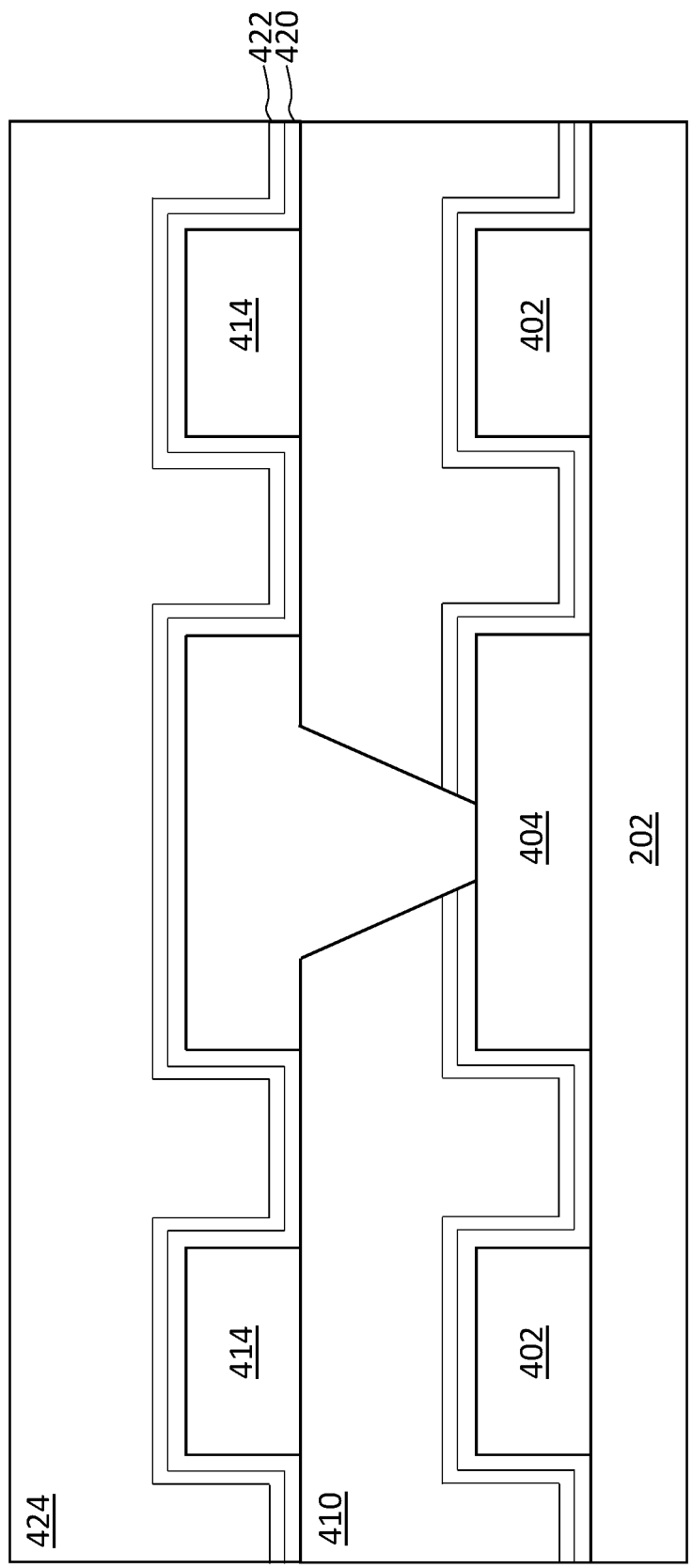

FIG. 4D illustrates the formation of a fourth dielectric layer 420 and a fifth dielectric layer 422 deposited over the second level of conductive structures, followed by formation of a sixth dielectric layer 424. Each of fourth dielectric layer 420, fifth dielectric layer 422, and sixth dielectric layer 424 may have substantially the same properties as discussed above for first dielectric layer 406, second dielectric layer 408, and third dielectric layer 410, respectively. Each of the first level of conductive structures and the second level of conductive structures may represent different metal levels of a multi-level interconnect structure within an integrated circuit package. It should be noted that not every metal layer need use a multilayer adhesion promoter. In some embodiments, the multilayer adhesion promoter films (e.g., layers 406 and 408, or layers 420 and 422) are used only for the layers where signal losses are critical.

Example System

Figure 5:
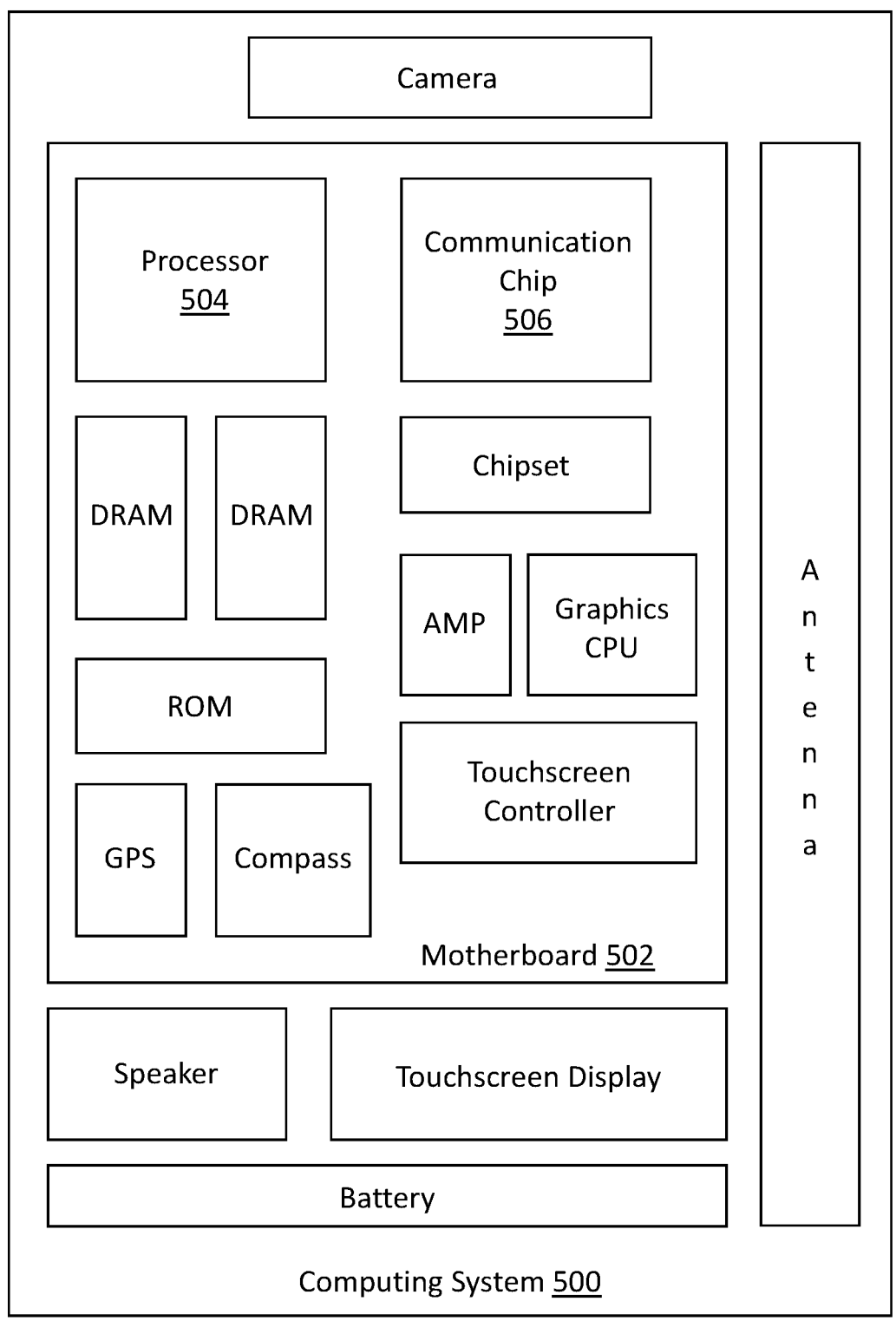
FIG. 5 illustrates a computing system including one or more of the microelectronic packages, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board, whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit device on a substrate, the substrate including conductive structures covered on at least one side by multi-layered dielectric films to simultaneously enhance both adhesion and conductivity, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. In some embodiments, communication chip 506 may include one or more conductive structures covered on at least one side by multi-layered dielectric films as variously described herein.

The processor 504 of the computing system 500 includes an integrated circuit die packaged within the processor 504. In some embodiments, the integrated circuit die of the processor includes onboard circuitry that is implemented with one or more conductive structures covered on at least one side by multi-layered dielectric films as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more conductive structures covered on at least one side by multi-layered dielectric films as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

Further Example Embodiments

The following examples pertain to further embodiments, from which numerous permutations and configurations will be apparent.

Example 1 is an integrated circuit package that includes a first structure and a second structure. The first structure has a conductive material on and/or within a first dielectric material and the first structure has at least one surface. The second structure has a first portion over the at least one surface of the first structure and includes a second dielectric material having a first dielectric constant, a second portion over the first portion and comprising a third dielectric material having a second dielectric constant, and a third portion over the second portion and comprising a fourth dielectric material having a third dielectric constant. The first dielectric constant is greater than the second dielectric constant and the second dielectric constant is greater than the third dielectric constant.

Example 2 includes the subject matter of Example 1, wherein the surface of the first structure has a surface roughness of 100 nm or less.

Example 3 includes the subject matter of Example 1 or 2, wherein the at least one surface of the first structure includes a first, second, and third surface, and the first portion is adjacent to each of the first, second, and third surface.

Example 4 includes the subject matter of any one of Examples 1-3, wherein the first structure comprises a copper or copper alloy transmission line.

Example 5 includes the subject matter of any one of Examples 1-4, wherein the second dielectric material comprises a nitride material, and the third dielectric comprises an oxide material.

Example 6 includes the subject matter of any one of Examples 1-5, wherein the first portion is a first layer, the second portion is a second layer, and the third portion is a third layer, and wherein the first, second, and third layers are distinct from one another, such that there is a first visible interface between the first and second layer, and a second visible interface between the second and third layer.

Example 7 includes the subject matter of any one of Examples 1-6, wherein the second dielectric constant is closer to the third dielectric constant than it is to the first dielectric constant.

Example 8 includes the subject matter of any one of Examples 1-7, wherein a thickness of the first portion is between about 50 nm and about 250 nm, and a thickness of the second portion is between about 50 nm and about 250 nm.

Example 9 includes the subject matter of any one of Examples 1-8, wherein the fourth dielectric material comprises carbon.

Example 10 includes the subject matter of Example 9, wherein the fourth dielectric material comprises Ajinomoto Build-up Film (ABF).

Example 11 is a printed circuit board comprising the integrated circuit package of any one of Examples 1-10.

Example 12 is a computing system comprising the integrated circuit package of any one of Examples 1-10.

Example 13 is a transmission line that includes a first structure and a second structure. The first structure comprises a conductive material and has at least one surface. The second structure includes a first layer over the at least one surface of the first structure and comprises a first dielectric material having a first dielectric constant, a second layer over the first layer where the second layer is compositionally distinct from the first layer and comprises a second dielectric material having a second dielectric constant, and a third layer over the second layer and comprising a third dielectric material having a third dielectric constant. The first dielectric constant is greater than the third dielectric constant and the second dielectric constant is less than the third dielectric constant.

Example 14 includes the subject matter of Example 13, wherein the surface of the first structure has a surface roughness of 100 nm or less.

Example 15 includes the subject matter of Example 13 or 14, wherein the at least one surface of the first structure includes a first, second, and third surface, and the first layer is adjacent to each of the first, second, and third surface.

Example 16 includes the subject matter of any one of Examples 13-15, wherein the first structure comprises copper or copper alloy.

Example 17 includes the subject matter of any one of Examples 13-16, wherein the first dielectric material comprises a nitride material, the second dielectric material comprises an oxide material, and the third dielectric material comprises carbon.

Example 18 includes the subject matter of any one of Examples 13-17, wherein the third dielectric material comprises Ajinomoto Build-up Film (ABF).

Example 19 includes the subject matter of any one of Examples 13-18, wherein the second dielectric constant is closer to the third dielectric constant than it is to the first dielectric constant.

Example 20 includes the subject matter of any one of Examples 13-19, wherein the first, second, and third layers are portions of a single continuous layer that has at least one element that is graded in concentration.

Example 21 includes the subject matter of any one of Examples 13-19, wherein the first layer, second layer, and third layer are distinct layers, such that there is a first visible interface between the first and second layer, and a second visible interface between the second and third layer.

Example 22 includes the subject matter of any one of Examples 13-20, wherein the first and second layers are portions of a single continuous layer, the first dielectric material comprising nitrogen, the second dielectric material comprising oxygen, and wherein the nitrogen concentration of the first dielectric material is graded, and the oxygen concentration of the second dielectric material is graded.

Example 23 is an integrated circuit package that includes a first layer having a dielectric material, a structure comprising a conductive material on and/or within the first layer, a second layer over the at least one surface of the structure, a third layer over the second layer, and a fourth layer over the third layer. The structure has at least one surface with a surface roughness of 100 nm or less. The second layer has a second dielectric material having a first dielectric constant. The third layer is compositionally distinct from the second layer and includes a third dielectric material having a second dielectric constant. The fourth layer includes a fourth dielectric material comprising carbon. The first dielectric constant is greater than the second dielectric constant.

Example 24 includes the subject matter of Example 23, wherein the at least one surface of the structure includes a first, second, and third surface, and the second layer is adjacent each of the first, second, and third surface.

Example 25 includes the subject matter of Example 23 or 24, wherein the structure comprises a copper or copper alloy transmission line.

Example 26 includes the subject matter of any one of Examples 23-25, wherein the second dielectric material comprises a nitride material.

Example 27 includes the subject matter of any one of Examples 23-26, wherein the third dielectric material comprises an oxide material.

Example 28 includes the subject matter of any one of Examples 23-27, wherein the fourth dielectric material has a third dielectric constant, and wherein the second dielectric constant is closer to the third dielectric constant than it is to the first dielectric constant.

Example 29 includes the subject matter of Example 28, wherein an average of the first dielectric constant and the second dielectric constant is substantially equal to the third dielectric constant.

Example 30 includes the subject matter of any one of Examples 23-29, wherein a thickness of the second layer is between about 50 nm and about 250 nm, and a thickness of the third layer is between about 50 nm and about 250 nm.

Example 31 includes the subject matter of any one of Examples 23-30, wherein the first, second, and third layers are portions of a single continuous layer that has at least two elements that are graded in concentration.

Example 32 includes the subject matter of any one of Examples 23-30, wherein the first layer, second layer, and third layer are distinct layers, such that there is a first visible interface between the first and second layer, and a second visible interface between the second and third layer.

Example 33 includes the subject matter of any one of Examples 23-32, wherein the first dielectric material comprises nitrogen, and the second dielectric material comprises oxygen, and wherein the nitrogen concentration of the first dielectric material is graded, and the oxygen concentration of the second dielectric material is graded.

Example 34 includes the subject matter of any one of Examples 23-33, wherein the fourth dielectric material comprises Ajinomoto Build-up Film (ABF).

Example 35 is a printed circuit board comprising the integrated circuit package of any one of Examples 23-34.

Example 36 is a computing system comprising the integrated circuit package of any one of Examples 23-34.

What is claimed is:

1. An integrated circuit package comprising:
a first structure comprising a conductive material on a first dielectric material, the conductive material of the first structure having a top and sides;
a second structure including a first portion on the top and sides of the conductive material of the first structure, the first portion comprising a second dielectric material having a first dielectric constant, a second portion over the first portion along the top and sides of the conductive material of the first structure, the second portion comprising a third dielectric material having a second dielectric constant, and a third portion over the second portion and comprising a fourth dielectric material having a third dielectric constant, wherein the first dielectric constant is greater than the second dielectric constant and the second dielectric constant is greater than the third dielectric constant.

2. The integrated circuit package of claim 1, wherein the top and sides of the conductive material of the first structure has a surface roughness of 100 nm or less.

3. The integrated circuit package of claim 1, wherein the second dielectric material comprises a nitride material, and the third dielectric comprises an oxide material.

4. The integrated circuit package of claim 1, wherein the first portion is a first layer, the second portion is a second layer, and the third portion is a third layer, and wherein the first, second, and third layers are distinct from one another, such that there is a first visible interface between the first and second layer, and a second visible interface between the second and third layer.

5. The integrated circuit package of claim 1, wherein the second dielectric constant is closer to the third dielectric constant than it is to the first dielectric constant.

6. The integrated circuit package of claim 1, wherein the fourth dielectric material comprises a build-up film.

7. A transmission line, comprising:
a first structure comprising a conductive material, the first structure having at least one surface;
a second structure including a first layer over the at least one surface of the first structure and comprising a first dielectric material having a first dielectric constant,
a second layer over the first layer,
the second layer being compositionally distinct from the first layer and comprising a second dielectric material having a second dielectric constant, and
a third layer over the second layer and comprising a third dielectric material having a third dielectric constant,
wherein the first dielectric constant is greater than the third dielectric constant and the second dielectric constant is less than the third dielectric constant.

8. The transmission line of claim 7, wherein the surface of the first structure has a surface roughness of 100 nm or less.

9. The transmission line of claim 7, wherein the first dielectric material comprises a nitride material, the second dielectric material comprises an oxide material, and the third dielectric material comprises carbon.

10. The transmission line of claim 9, wherein the third dielectric material comprises a build-up film.

11. The transmission line of claim 7, wherein the first, second, and third layers are portions of a single continuous layer that has at least one element that is graded in concentration.

12. The transmission line of claim 7, wherein the first layer, second layer, and third layer are distinct layers, such that there is a first visible interface between the first and second layer, and a second visible interface between the second and third layer.

13. An integrated circuit package comprising:
a first layer comprising a first dielectric material;
a structure comprising a conductive material on and/or within the first layer, the structure having at least one surface with a surface roughness of 100 nm or less;
a second layer over the at least one surface of the structure and comprising a second dielectric material having a first dielectric constant;
a third layer over the second layer, the third layer being compositionally distinct from the second layer and comprising a third dielectric material having a second dielectric constant; and
a fourth layer over the third layer and comprising a fourth dielectric material comprising carbon, wherein the first dielectric constant is greater than the second dielectric constant, wherein the fourth dielectric material has a third dielectric constant, and an average of the first dielectric constant and the second dielectric constant is substantially equal to the third dielectric constant.

14. The integrated circuit package of claim 13, wherein the at least one surface of the structure includes a first, second, and third surface, and the second layer is adjacent each of the first, second, and third surface.

15. The integrated circuit package of claim 13, wherein the second dielectric material comprises a nitride material and the third dielectric material comprises an oxide material.

16. The integrated circuit package of claim 13, wherein the first, second, and third layers are portions of a single continuous layer that has at least two elements that are graded in concentration.

17. The integrated circuit package of claim 13, wherein the first layer, second layer, and third layer are distinct layers, such that there is a first visible interface between the first and second layer, and a second visible interface between the second and third layer.

18. The integrated circuit package of claim 13 wherein the fourth dielectric material comprises a build-up film.

19. An integrated circuit package comprising:
   a first layer comprising a first dielectric material;
   a structure comprising a conductive material on and/or within the first layer, the structure having at least one surface with a surface roughness of 100 nm or less;
   a second layer over the at least one surface of the structure and comprising a second dielectric material having a first dielectric constant;
   a third layer over the second layer, the third layer being compositionally distinct from the second layer and comprising a third dielectric material having a second dielectric constant; and
   a fourth layer over the third layer and comprising a fourth dielectric material comprising carbon, wherein the first dielectric constant is greater than the second dielectric constant, wherein the first, second, and third layers are portions of a single continuous layer that has at least two elements that are graded in concentration.

* * * * *